(12) United States Patent
Katagiri et al.

(10) Patent No.: US 10,437,102 B2
(45) Date of Patent: Oct. 8, 2019

(54) DISPLAY DEVICE

(71) Applicant: Panasonic Liquid Crystal Display Co., Ltd., Himeji-shi, Hyogo (JP)

(72) Inventors: Yusuke Katagiri, Hyogo (JP); Masaki Tsubokura, Hyogo (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 145 days.

(21) Appl. No.: 15/648,017

(22) Filed: Jul. 12, 2017

(65) Prior Publication Data

US 2018/0017825 A1 Jan. 18, 2018

(30) Foreign Application Priority Data

Jul. 13, 2016 (JP) .................. 2016-138768

(51) Int. Cl.
*G02F 1/13357* (2006.01)
*G02F 1/1335* (2006.01)
(Continued)

(52) U.S. Cl.
CPC .. *G02F 1/133608* (2013.01); *G02F 1/133305* (2013.01); *G02F 1/133308* (2013.01);
(Continued)

(58) Field of Classification Search
CPC ......... G02F 1/133305; G02F 1/133308; G02F 1/133382; G02F 1/13452; G02F 1/1347; G02F 2001/133314; G02F 2001/133317; G02F 2001/13331; G02F 2001/133342; G02F 2001/133388; G02F 1/133385; G02F 1/13336; G02F 1/33602; G02F 1/133608; G02F 1/1336; G02F 1/1335; G02F 1/1333; G02F 1/133; G02F 1/13; G02F 1/0305; G02F 1/03; G02F 1/0102; G02F 1/01; G02F 1/0009; G02F 1/1339; G02F 1/13394;
(Continued)

(56) References Cited

U.S. PATENT DOCUMENTS 5,659,376 A * 8/1997 Uehara ............ G02F 1/133308 348/794
5,838,401 A * 11/1998 Uehara ............ G02F 1/133308 349/58

(Continued)

FOREIGN PATENT DOCUMENTS

| JP | 2001-174789 | 6/2001 |
| JP | 2007-310161 | 11/2007 |
| JP | 2011-227356 | 10/2011 |

OTHER PUBLICATIONS

Office Action issued in U.S. Appl. No. 15/648,077, dated Apr. 19, 2018, 12 pages.

*Primary Examiner* — Julie Anne Watko
(74) *Attorney, Agent, or Firm* — Hamre, Schumann, Mueller & Larson, P.C.

(57) ABSTRACT

A display device includes: a display panel; a driver IC that outputs a driving signal to the display panel; a flexible substrate on which the driver IC is mounted; a first frame that supports the display panel from a side of a light source; and a second frame that supports the light source while being provided independently of the first frame. The first frame includes a metallic frame unit which is opposite to the driver IC from the side of the light source.

16 Claims, 14 Drawing Sheets

(51) Int. Cl.
  *G02F 1/1333* (2006.01)
  *G02F 1/1339* (2006.01)
  *G02F 1/1347* (2006.01)
  *G02F 1/1345* (2006.01)

(52) U.S. Cl.
  CPC ...... *G02F 1/133382* (2013.01); *G02F 1/1336* (2013.01); *G02F 1/1347* (2013.01); *G02F 1/13452* (2013.01); *G02F 2001/13398* (2013.01); *G02F 2001/133314* (2013.01); *G02F 2001/133317* (2013.01)

(58) Field of Classification Search
  CPC ................... G02F 1/00; G02F 1/13306; G02F 2001/133308; G02F 1/133603; G02F 1/133604; G02F 2001/13456; G02F 2001/13396; G02F 2001/13398
  See application file for complete search history.

(56) References Cited

U.S. PATENT DOCUMENTS

| | | | |
|---|---|---|---|
| 7,508,673 B2 * | 3/2009 | Kim | H01J 11/10 |
| | | | 313/46 |
| 2001/0046008 A1 * | 11/2001 | Ueda | G02F 1/1347 |
| | | | 349/74 |
| 2012/0162880 A1 * | 6/2012 | Yoon | H04N 5/64 |
| | | | 361/679.01 |

* cited by examiner

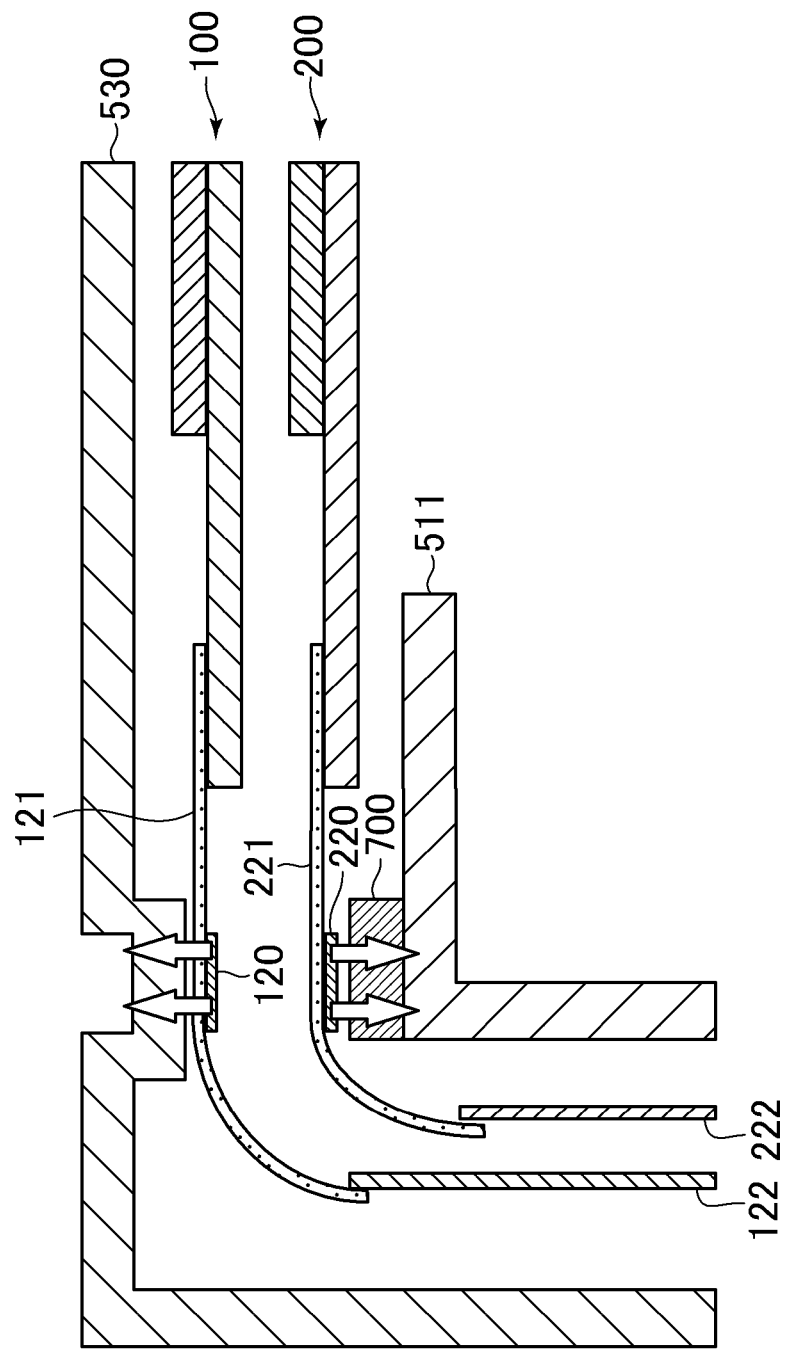

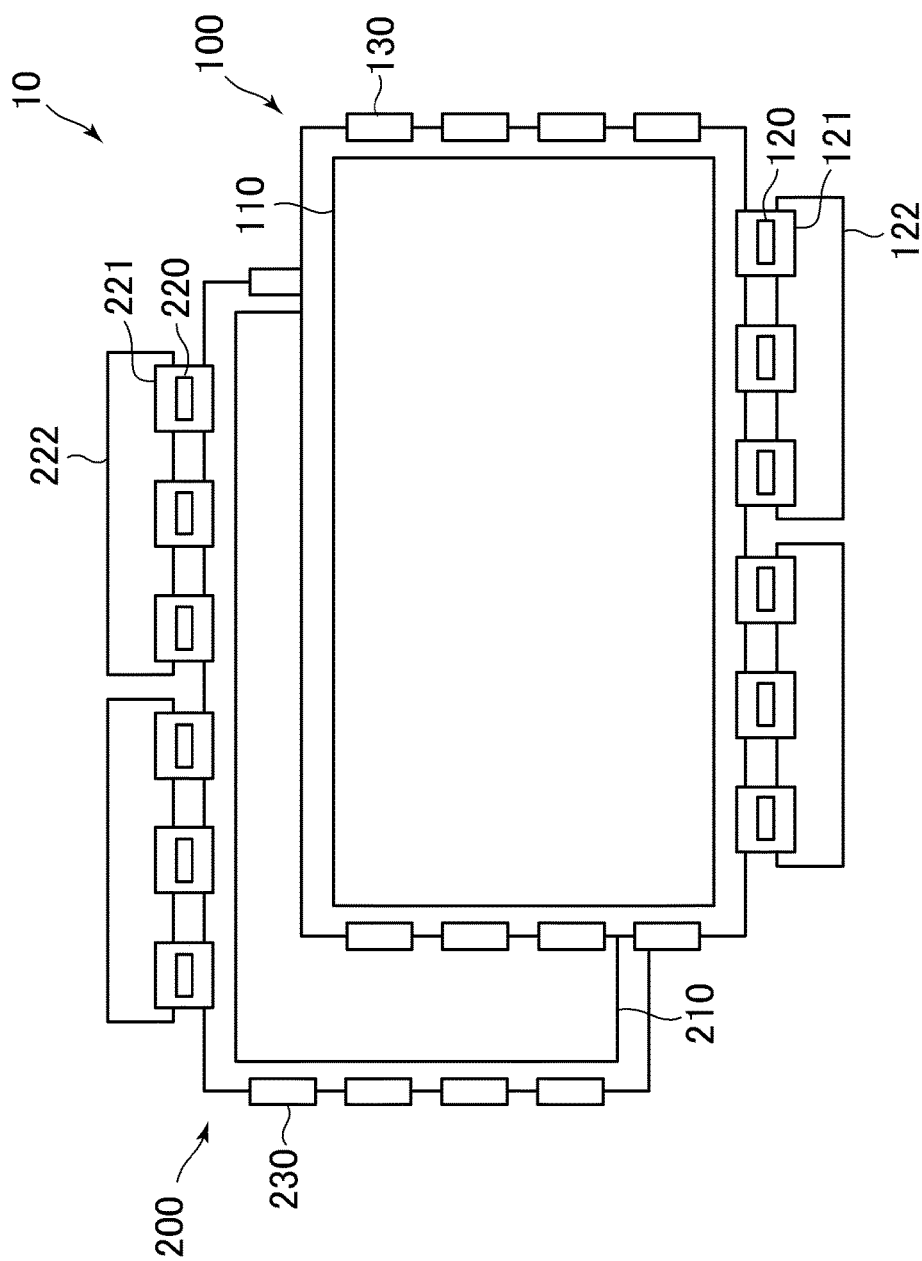

DISPLAY DEVICE

CROSS-REFERENCE TO RELATED APPLICATION

This application claims priority from Japanese application JP 2016-138768, filed Jul. 13, 2016. This Japanese application is incorporated herein by reference.

TECHNICAL FIELD

The present invention relates to a display device.

BACKGROUND

Conventionally, in a display device, a technology of improving a heat dissipation property of a driver IC has been proposed to prevent a malfunction caused by heat generation of the driver IC. For example, in a technology disclosed in Unexamined Japanese Patent Publication No. 2011-227356, heat dissipation holes are made in a metallic rear frame (lower frame) and a resin cell guide (middle frame) while being opposite to the driver IC mounted on a printed wiring film, thereby promoting the heat dissipation of the driver IC.

SUMMARY

In the conventional configuration described above, heat generated in the driver IC can be dissipated through the heat dissipation holes. However, because the driver IC is surrounded by the resin cell guide, and surroundings of the driver IC are easily filled with the heat, a sufficient heat dissipation effect is hardly obtained.

In a display device disclosed in Unexamined Japanese Patent Publication No. 2007-310161, a plurality of display panels overlap each other, and an image is displayed on each display panel, thereby achieving high contrast. However, in the display device, because the driver ICs of the display panels are disposed close to each other, particularly the driver ICs disposed on a backlight side easily become a high-temperature state. It is more difficult to dissipate the heat of the driver IC in such a display device.

The present disclosure is made in consideration of such a situation, and an object of the present disclosure is to provide a display device that can improve the heat dissipation property of the driver IC.

To solve the above problem, a display device according to a present disclosure comprises: a display panel that displays an image; a driver IC that outputs a driving signal to the display panel; a flexible substrate on which the driver IC is mounted; a first frame that supports the display panel from a side of a light source that emits light toward the display panel; and a second frame that supports the light source while being provided independently of the first frame, wherein the first frame includes a metallic frame unit, and the metallic frame unit is opposite to the driver IC from the side of the light source.

In the display device according to the present disclosure, heat generated in the driver IC may be transferred to the metallic frame unit by heat conduction in solids.

In the display device according to the present disclosure, the driver IC may be in direct contact with the metallic frame unit, or in contact with the metallic frame unit through another member interposed the driver IC and the metallic frame unit.

In the display device according to the present disclosure, an elastic member having a heat dissipation property may be disposed between the driver IC and the metallic frame unit, and heat generated in the driver IC may be transferred to the metallic frame unit through the elastic member.

The display device according to the present disclosure may further comprise a third frame that is made of a metallic material and covers an outer peripheral area of the display panel, wherein the display panel may include a first display panel and a second display panel disposed closer to the light source than the first display panel, the driver IC may include a first driver IC that outputs a driving signal to the first display panel and a second driver IC that outputs a driving signal to the second display panel, and the first driver IC may be opposite to the third frame while the second driver IC may be opposite to the metallic frame unit.

In the display device according to the present disclosure, the first driver IC may be in contact with the third frame, or in contact with the third frame through another member interposed between the first driver IC and the third frame, and the second driver IC may be in contact with the metallic frame unit, or in contact with the metallic frame unit through another member interposed between the second driver IC and the metallic frame unit.

In the display device according to the present disclosure, in planar view, the first driver IC may be disposed on a first side of a display screen, and the second driver IC may be disposed on a second side opposite to the first side of the display screen.

In the display device according to the present disclosure, the first frame may include a resin spacer, and the resin spacer may retain a distance between the first frame and the third frame.

In the display device according to the present disclosure, the flexible substrate may include a plurality of first flexible substrates on each of which a corresponding first driver IC is mounted and a plurality of second flexible substrates on each of which a corresponding second driver IC is mounted, and the resin spacer may include a first resin spacer protruding from a first frame side toward a third frame side through between first flexible substrates adjacent to each other and a second resin spacer protruding from the first frame side toward the third frame side through between second flexible substrates adjacent to each other.

In the display device according to the present disclosure, the metallic frame unit may include a sidewall extending in a direction perpendicular to a display screen, the second frame may include a sidewall extending in the direction perpendicular to the display screen, and a gap may be formed between the sidewall of the metallic frame unit and the sidewall of the second frame.

A gap may be formed between a sidewall extending in a direction perpendicular to a display screen in the metallic frame unit and a sidewall extending in the direction perpendicular to the display screen in the second frame.

The display device according to the present disclosure enables an improvement of a heat dissipation property of driver ICs.

BRIEF DESCRIPTION OF THE DRAWINGS

FIG. 3B is a sectional perspective view taken along line A-A' in FIG. 2, and illustrates a state in which an upper frame is seen through;

FIG. 4 is a partially sectional view taken along line B-B' in FIG. 2;

FIG. 5 is a plan view illustrating a schematic configuration of liquid crystal display device according to another present exemplary embodiment;

DETAILED DESCRIPTION

Hereinafter, an exemplary embodiment of the present disclosure will be described with reference to the drawings. In the exemplary embodiment, a liquid crystal display device is described as an example of display device. However the present disclosure is not limited to the liquid crystal display device. For example the present disclosure may be an organic electroluminescence display (OLED) device.

For example, a liquid crystal display device of the present exemplary embodiment includes a plurality of display panels that display images, a plurality of driving circuits (a plurality of source driver ICs and a plurality of gate driver ICs) that drive the display panels, a plurality of timing controllers that control the driving circuits, an image processor that performs image processing on an input video signal input from an outside and outputs image data to each of the timing controllers, and a backlight that irradiates the plurality of display panels with light from a rear surface side. There is no limitation to the number of display panels, but one or at least two display panels may be used. In a case in which the plurality of display panels are used, when viewed from an observer side, the plurality of display panels are disposed while overlapping each other in a front-back direction, and an image is displayed on each display panel. Liquid crystal display device 10 including two display panels will be described below by way of example.

Figure 1:
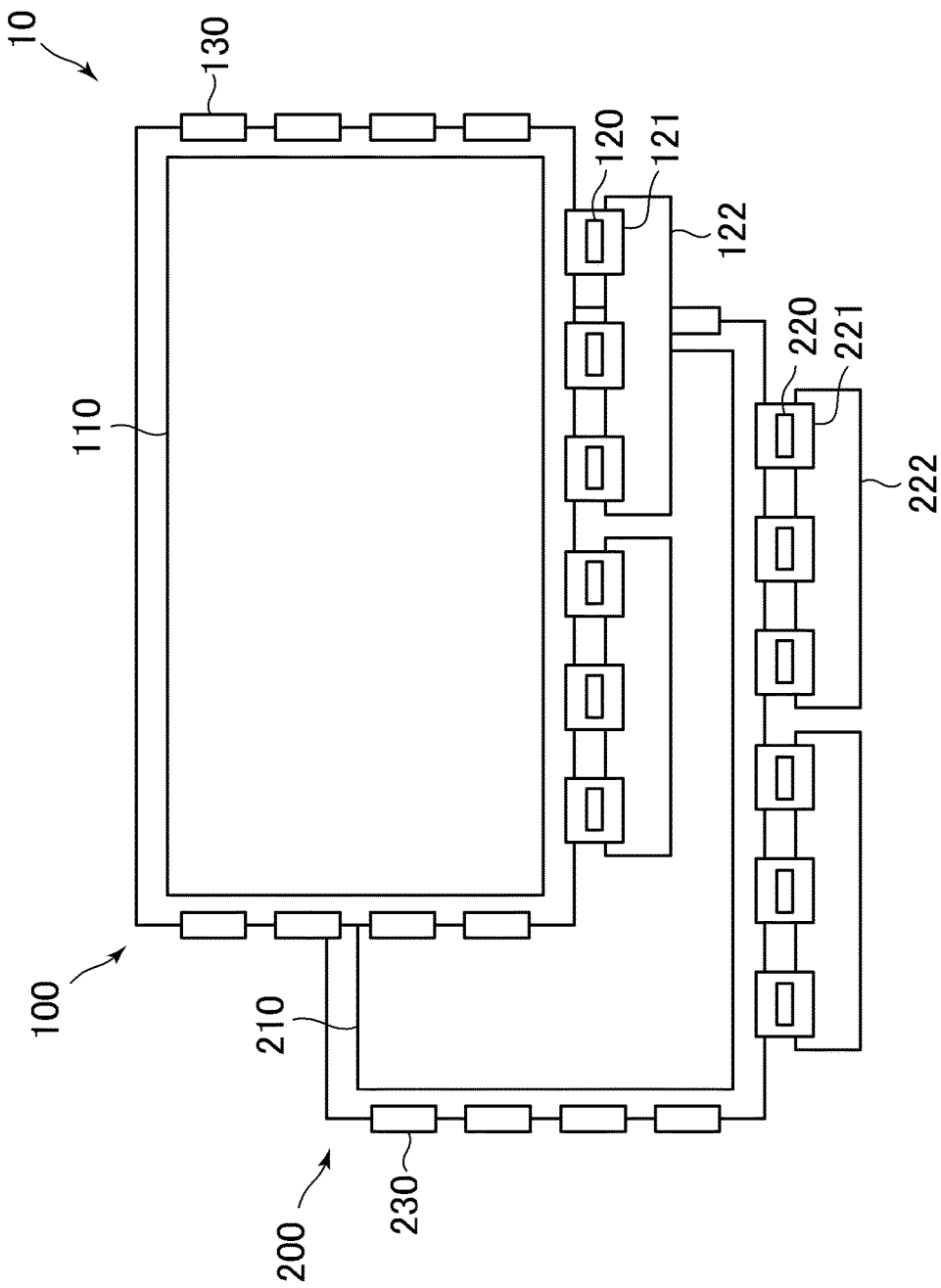
FIG. 1 is a plan view illustrating a schematic configuration of liquid crystal display device according to the present exemplary embodiment.

FIG. 1 is a plan view illustrating a schematic configuration of liquid crystal display device 10 according to the present exemplary embodiment. As illustrated in FIG. 1, liquid crystal display device 10 includes first display panel 100 disposed closer to an observer (front side), second display panel 200 disposed closer to a backlight (rear side) than first display panel 100, first source driver ICs 120 and first gate driver ICs 130 which are provided in first display panel 100, and second source driver ICs 220 and second gate driver ICs 230, which are provided in second display panel 200. There is no limitation to the number of driver ICs. A backlight (not illustrated in FIG. 1) is disposed on a rear surface side of second display panel 200. First display panel 100 and second display panel 200 have an identical outer shape in planar view.

For example, first source driver ICs 120 are mounted on first flexible substrates 121 (for example, flexible printed circuits (FPCs)) by using a chip-on-film (COF) method. First flexible substrates 121 are connected to first circuit board 122 (for example, printed circuit board (PCB)). For example, first gate driver ICs 130 are mounted on a thin-film-transistor substrate (TFT substrate) by using a chip-on-glass (COG) method. Image data and various timing signals, which are output from a timing controller (not illustrated) for first display panel 100, are input to first source driver ICs 120 and first gate driver ICs 130 through first circuit board 122.

For example, second source driver ICs 220 are mounted on second flexible substrates 221 (for example, flexible printed circuits (FPCs)) by using the COF method. Second flexible substrates 221 are connected to second circuit board 222 (for example, PCB). For example, second gate driver ICs 230 are mounted on a thin-film-transistor substrate (TFT substrate) by using the COG method. Image data and various timing signals, which are output from a timing controller (not illustrated) for second display panel 200, are input to second source driver ICs 220 and second gate driver ICs 230 through second circuit board 222.

First display panel 100 displays a color image in image display region 110 according to the input video signal, and second display panel 200 displays a monochrome image in image display region 210 according to the input video signal. The monochrome image and the color image are displayed on a display screen while overlapping each other, which gives a high-contrast image.

Figure 2:
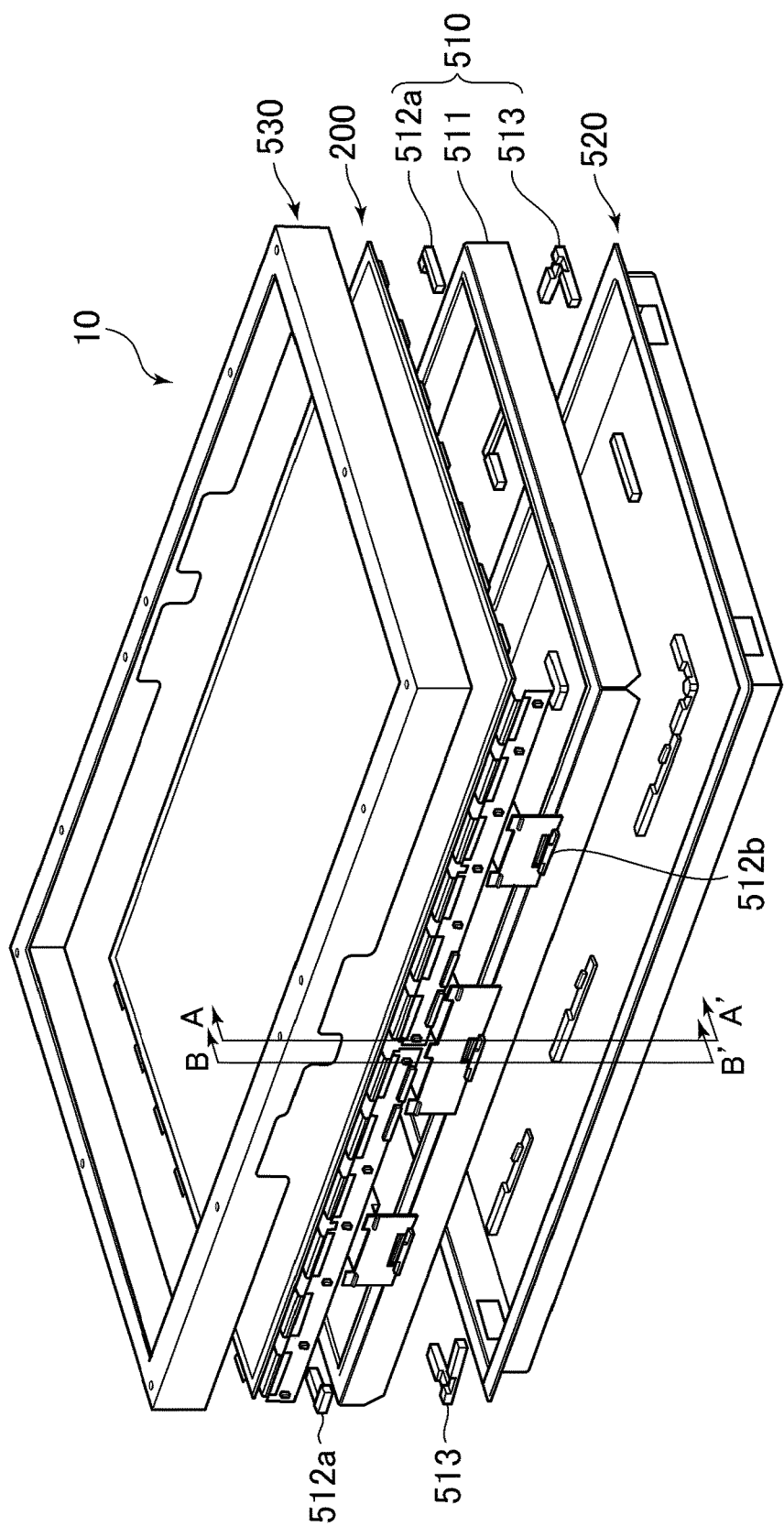
FIG. 2 is an exploded perspective view illustrating the schematic configuration of liquid crystal display device of the present exemplary embodiment, in which a first display panel is not illustrated for convenience.

FIG. 2 is an exploded perspective view illustrating the schematic configuration of liquid crystal display device 10 of the present exemplary embodiment. For convenience, first display panel 100 is not illustrated in FIG. 2.

In liquid crystal display device 10, upper frame 530 (third frame), first display panel 100, second display panel 200, middle frame 510 (first frame), and lower frame 520 (second frame) are separately disposed in this order from the observer side. Lower frame 520 is made of a metallic material, and formed into a concave shape as a whole. Lower frame 520 accommodates light source 410 constituting backlight 400, and retains diffuser plate 420, optical sheet 430, and the like, which constitute backlight 400 (see FIG. 3). Middle frame 510 includes metallic frame unit 511 made of a metallic material and formed into a frame shape, upper resin spacer 512 disposed between metallic frame unit 511 and upper frame 530, and lower resin spacer 513 disposed between metallic frame unit 511 and lower frame 520. Upper resin spacer 512 and lower resin spacer 513 are made of a resin material. Middle frame 510 supports first display panel 100 and second display panel 200 from a backlight side. Upper resin spacer 512 includes upper resin spacers 512a disposed in corners of metallic frame unit 511 and upper resin spacers 512b disposed in areas (sides) between the corners of metallic frame unit 511. Upper resin spacers 512a are formed into an L-shape in planar view of liquid crystal display device 10, and a whole of upper resin spacer 512a is disposed on metallic frame unit 511. Upper resin spacers 512b are formed into an L-shape in side view of liquid crystal display device 10. A part of upper resin spacer 512b is disposed on metallic frame unit 511 while another part of upper resin spacer 512b is disposed on a side face of metallic frame unit 511. Upper resin spacer 512 has a function as a positioning member positioning first display panel 100 and second display panel 200 in a horizontal direction in addition to a function as a retaining member retaining a distance between metallic frame unit 511 and upper frame 530. A configuration in which first display panel 100 and second display panel 200 are positioned using upper resin spacer 512 will be described later. Upper frame 530 is made of a metallic material and formed into a frame shape. Upper frame 530 covers outer peripheral area (frame region) of first display panel 100 and second display panel 200 from the observer side. For example, upper frame 530, middle frame 510, and lower frame 520 are fixed to one another using screws.

Figure 3A:
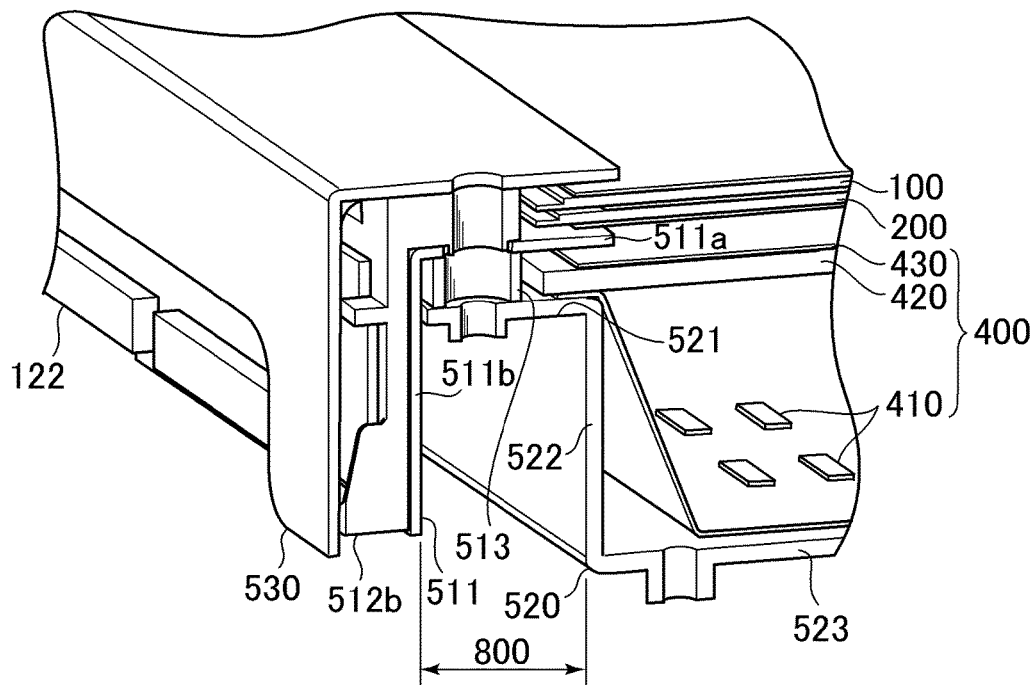
FIG. 3A is a sectional perspective view taken along line A-A' in FIG. 2, and illustrates a state in which an upper frame is attached.
Figure 3B:
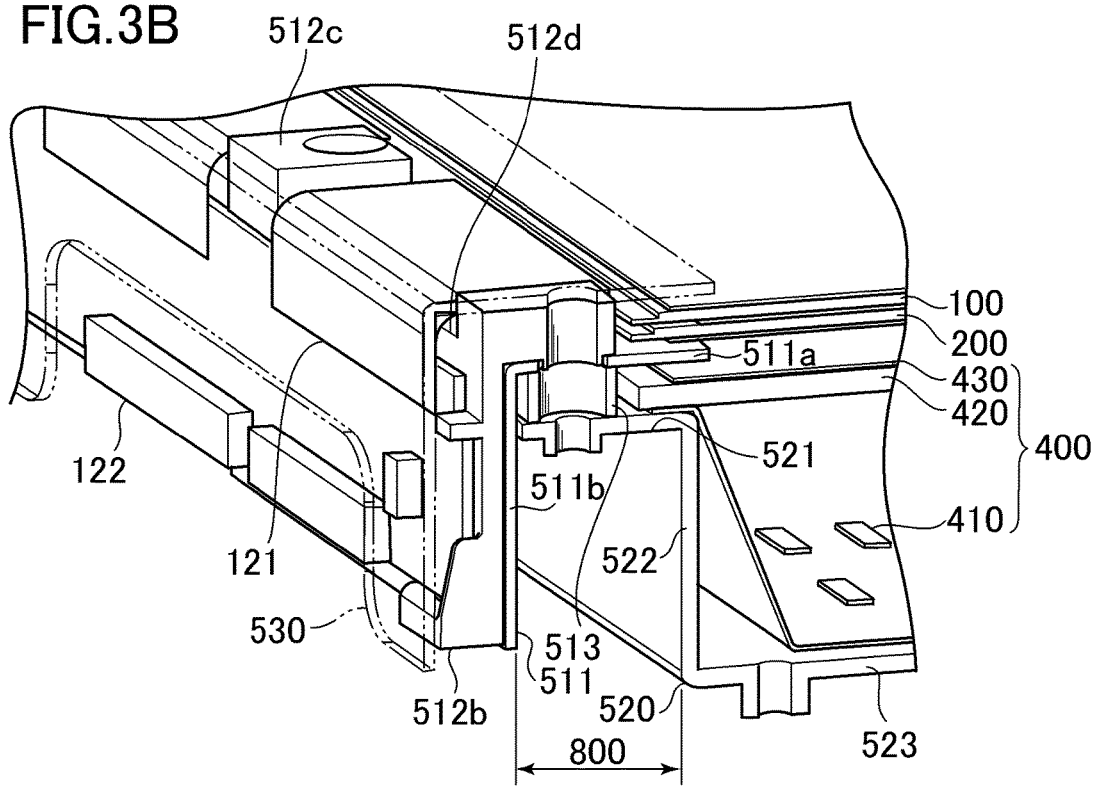

Each of FIGS. 3A and 3B is a sectional perspective view taken along line A-A' in FIG. 2. Each of FIGS. 3A and 3B illustrates a state in which liquid crystal display device 10 is assembled, and illustrates both first display panel 100 and second display panel 200. FIG. 3A illustrates a state in which upper frame 530 is attached, and FIG. 3B illustrates a state in which upper frame 530 is seen through.

As illustrated in FIGS. 3A and 3B, first flexible substrate 121 is bent so that first circuit board 122 of first display panel 100 is positioned in a side of liquid crystal display 10. First flexible substrate 121 is retained by upper resin spacer 512b. Protrusions 512c protruding onto a side of upper frame 530 and notches 512d are formed on a display surface side (observer side) of upper resin spacer 512b, and first flexible substrates 121 are respectively disposed in notch 512d. In the case that a plurality of first flexible substrates 121 are disposed, each protrusion 512c passes between first flexible substrates 121 adjacent to each other, and protrudes onto the side of upper frame 530. Although not illustrated in FIGS. 3A and 3B, similarly second flexible substrate 221 is bent so that second circuit board 222 of second display panel 200 is positioned in a side of liquid crystal display 10. Second flexible substrate 221 is retained by upper resin spacer 512b. Second flexible substrates 221 are respectively disposed in notches 512d formed in upper resin spacers 512b. In the case that a plurality of second flexible substrates 221 are disposed, each protrusion 512c formed in upper resin spacer 512b passes between second flexible substrates 221 adjacent to each other, and protrudes onto the side of upper frame 530. Ends of first display panel 100 and second display panel 200 are disposed in a gap, which is formed between upper frame 530 and middle frame 510 using upper resin spacer 512. Ends of diffuser plate 420, optical sheet 430, and the like are disposed in a gap, which is formed between middle frame 510 and lower frame 520 using lower resin spacer 513.

FIG. 4 is a partially sectional view taken along line B-B' in FIG. 2. FIG. 4 schematically illustrates a state in which a region including first source driver IC 120 and second source driver IC 220 is partially enlarged.

As illustrated in FIG. 4, first source driver IC 120 is disposed so as to be opposite to upper frame 530 through first flexible substrates 121 interposed therebetween, more particularly to be in contact with upper frame 530 through first flexible substrates 121 interposed therebetween. First source driver IC 120 may directly be in contact with upper frame 530. Because upper frame 530 is made of the metallic material, the heat generated in first source driver IC 120 is transferred to upper frame 530 by heat conduction in solids. Therefore, the heat generated in first source driver IC 120 can be dissipated to the outside (upward arrow direction) through upper frame 530. A portion of upper frame 530 opposite to first source driver IC 120 may protrude onto the backlight side. This enables improvement of the heat dissipation property of first source driver IC 120. Second source driver IC 220 is disposed so as to be opposite to metallic frame unit 511 of middle frame 510, more particularly to be in contact with metallic frame unit 511 through elastic member 700 interposed therebetween, elastic member 700 having a high heat dissipation property. Second source driver IC 220 may directly be in contact with metallic frame unit 511. Because metallic frame unit 511 is made of the metallic material, the heat generated in second source driver IC 220 is transferred to metallic frame unit 511 through elastic member 700 by heat conduction in solids. Therefore, the heat generated in second source driver IC 220 can be dissipated to the outside (downward arrow direction) through metallic frame unit 511. As illustrated in FIG. 4, elastic member 700 (for example, rubber) having the high heat dissipation property may be provided between second source driver IC 220 and metallic frame unit 511. Therefore, the heat dissipation property of second source driver IC 220 can be improved while damage of second source driver IC 220 is prevented. Thus, first source driver IC 120 and second source driver IC 220 adopt structures that dissipate the heat to individual metallic frames (upper frame 530 and metallic frame unit 511), so that the heat generated in each driver IC can effectively be dissipated. This enables prevention of a malfunction associated with a temperature rise of each driver IC.

In the example of FIGS. 3A and 3B, metallic frame unit 511 of middle frame 510 includes opposite frame plate 511a that is disposed so as to be opposite to first display panel 100 and second display panel 200 from the rear surface side and sidewall 511b hung onto the rear surface side from an outer peripheral end of opposite frame plate 511a. Opposite frame plate 511a is disposed between second display panel 200, and diffuser plate 420 and optical sheet 430 which constitute backlight 400. Opposite frame plate 511a is parallel to the display screen. Sidewall 511b extends in a direction perpendicular to the display screen, and surrounds peripheries of diffuser plate 420 and optical sheet 430, which constitute backlight 400.

Lower frame 520 includes peripheral frame plate 521 positioned opposite to opposite frame plate 511a of metallic frame unit 511, rear-surface plate 523 disposed opposite to backlight 400 from an opposite side to the observer, and sidewall 522 extending between an inner peripheral end of peripheral frame plate 521 and an outer peripheral end of rear-surface plate 523. Lower resin spacer 513 is disposed on peripheral frame plate 521, and peripheral frame plate 521 supports opposite frame plate 511a of metallic frame unit 511 with lower resin spacer 513 interposed therebetween. Sidewall 522 extends in the direction perpendicular to the display screen, and surrounds a periphery of backlight 400.

As illustrated in FIGS. 3A and 3B, gap 800 may be formed between middle frame 510 (in particular, metallic frame unit 511) and lower frame 520. Specifically, gap 800 is formed between sidewall 511b of metallic frame unit 511 and sidewall 522 of lower frame 520. Therefore, the heat transferred from second source driver IC 220 to metallic frame unit 511 is easily dissipated from a neighborhood of gap 800 to the outside, so that the heat dissipation property can further be improved.

As can be seen from FIGS. 3A and 3B, metallic frame unit 511 of middle frame 510 is supported by lower frame 520 with lower resin spacer 513 interposed therebetween, but is not in contact with lower frame 520. That is, metallic frame unit 511 is spaced apart from lower frame 520, and therefore the heat is not directly transferred from metallic frame unit 511 to lower frame 520 by heat conduction in solids. In this manner, metallic frame unit 511 and metallic lower frame 520, which are spaced apart from each other, are layered with lower resin spacer 513 interposed therebetween, lower resin spacer 513 having heat conductivity lower than that of metallic frame unit 511 and metallic lower frame 520. Therefore, the heat is hardly transferred between metallic frame unit 511 and lower frame 520. For this reason, even if lower frame 520 is warmed by heat from light source 410 of backlight 400, the heat from second source driver IC 220 is dissipated while transferred to metallic frame unit 511 separated from lower frame 520, so that the heat dissipation property of second source driver IC 220 can be improved.

In the example illustrated in FIGS. 3A and 3B, backlight 400 includes a plurality of light sources 410 that are accommodated in lower frame 520 while attached to lower frame 520, and diffuser plate 420 and optical sheet 430, which are disposed between light source 410 and second display panel 200. For example, light sources 410 illustrated in FIG. 2 are constructed with light-emitting diodes (LEDs), and are two-dimensionally arranged at intervals in lower frame 520.

A positional relationship between first display panel 100 and second display panel 200 is not limited to the configuration illustrated in FIG. 1. For example, as illustrated in FIG. 5, in planar view of liquid crystal display device 10, first source driver ICs 120, first flexible substrates 121, and first circuit board 122 may be disposed on a lower side of the display screen, second source driver ICs 220, second flexible substrates 221, and second circuit board 222 may be disposed on an upper side of the display screen, and first display panel 100 and second display panel 200 may be disposed while positions of first display panel 100 and second display panel 200 are vertically inverted. In the configuration of FIG. 5, each of first source driver ICs 120 and second source driver ICs 220 is sandwiched between metallic upper frame 530 and metallic frame unit 511, so that the heat dissipation property of each driver IC can further be improved.

The heat dissipation structure against the heat generated in the source driver IC is described above. However the display device of the present disclosure is not limited thereto, and can also be applied to a gate driver IC.

Next, the configuration in which first display panel 100 and second display panel 200 are positioned using upper resin spacer 512 will be described below.

Figure 6:
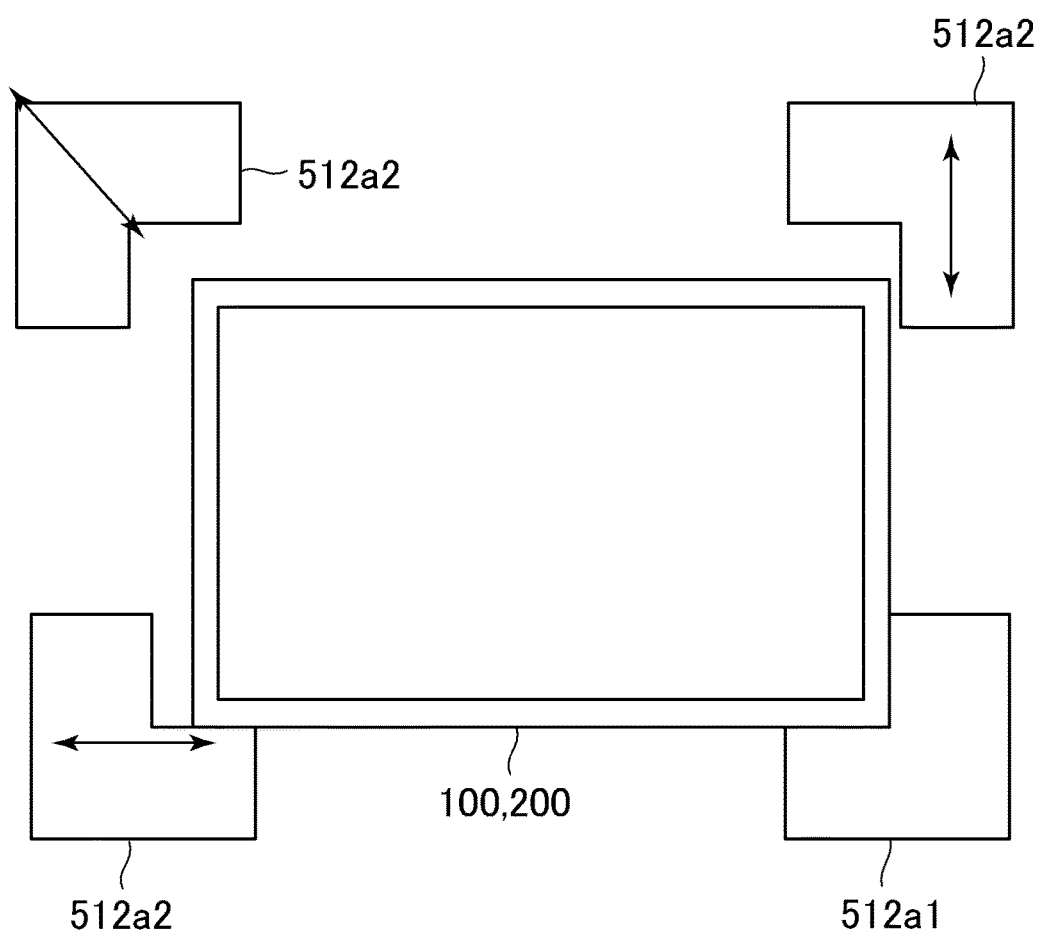
FIG. 6 is a plan view illustrating a configuration that positions a first display panel and a second display panel.

FIG. 6 is a plan view illustrating a configuration that positions first display panel 100 and second display panel 200. FIG. 6 illustrates first display panel 100, second display panel 200, and four upper resin spacers 512a respectively disposed in the corners of middle frame 510 (metallic frame unit 511). Each upper resin spacer 512a is formed into the L-shape in planar view of liquid crystal display device 10, and upper resin spacers 512a are respectively in contact with two sides (for example, left and upper sides, upper and right sides, right and lower sides, and lower and left sides) in each of first display panel 100 and second display panel 200, thereby horizontally fixing display panels 100, 200. One of four upper resin spacers 512a (lower-right upper resin spacer 512a in FIG. 6) is attached to metallic frame unit 511 so as not to be horizontally moved, and acts as a reference spacer. Remaining three upper resin spacers 512a are attached to metallic frame unit 511 while positions of upper resin spacers 512a are horizontally adjustable, and act as position adjusting spacers.

Figure 7A:
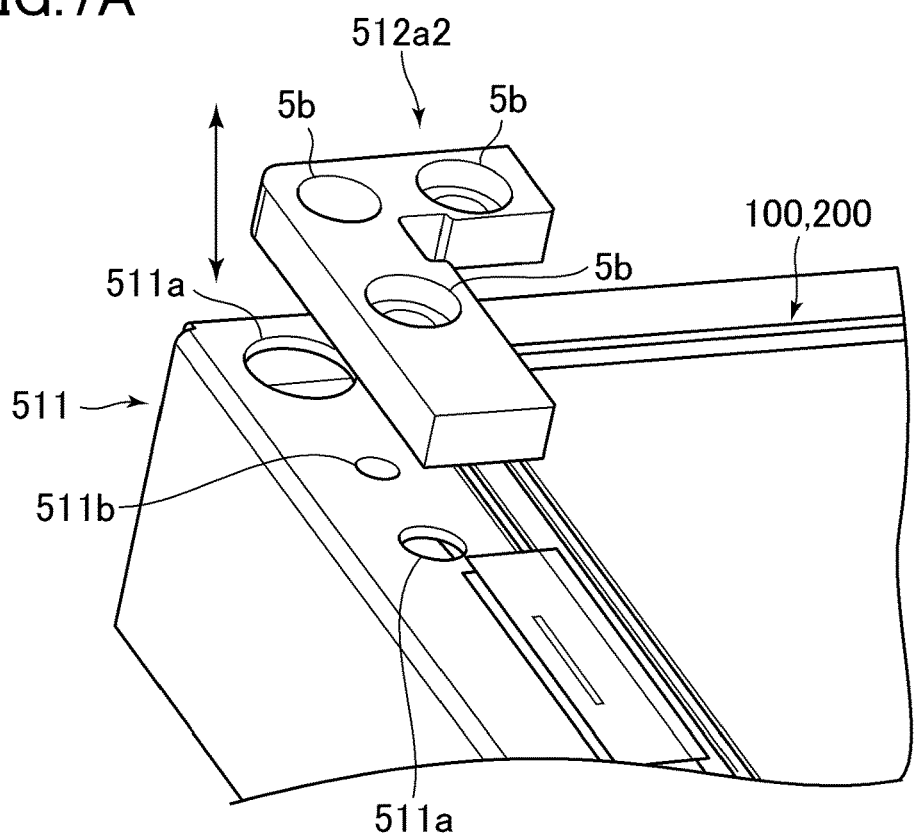
FIG. 7A is a perspective view illustrating a configuration of an upper resin spacer for position adjustment.
Figure 7B:
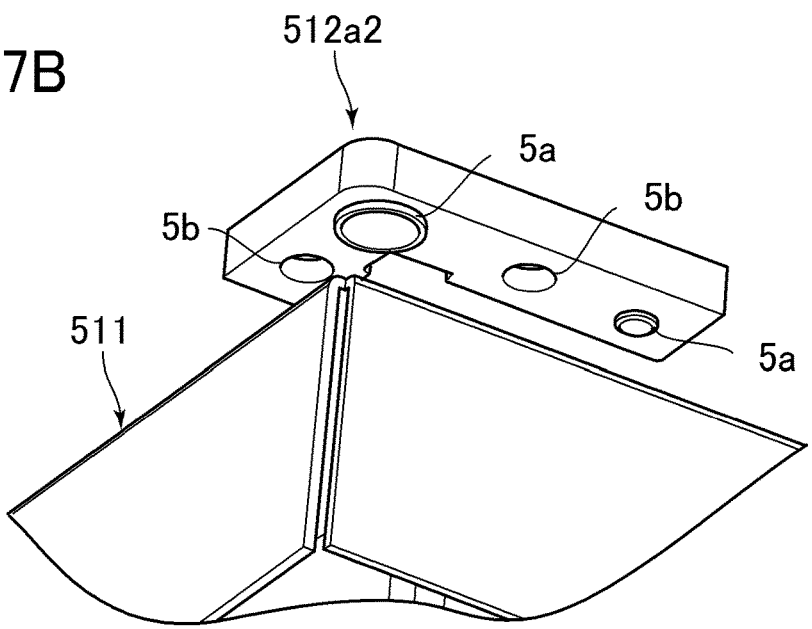
FIG. 7B is a perspective view illustrating a configuration of an upper resin spacer for position adjustment.

Each of FIGS. 7A and 7B is a perspective view illustrating a configuration of upper resin spacer 512a for position adjustment (hereinafter, referred to as position adjusting spacer 512a2). Position adjusting spacer 512a2 includes protruding sections 5a protruding onto the backlight side and screw hole sections 5b in which screws are inserted in order to screw position adjusting spacer 512a2 on metallic frame unit 511. Metallic frame unit 511 includes receiver section 511a that receives protruding section 5a and screw hole sections 511b in which the screws are inserted. For example, protruding section 5a and receiver section 511a are formed into a circular shape in planar view, and receiver section 511a is formed larger than protruding section 5a. Therefore, on metallic frame unit 511, position adjusting spacer 512a2 can horizontally be position-adjusted (moved) by a difference in size between receiver section 511a and protruding section 5a.

Figure 8:
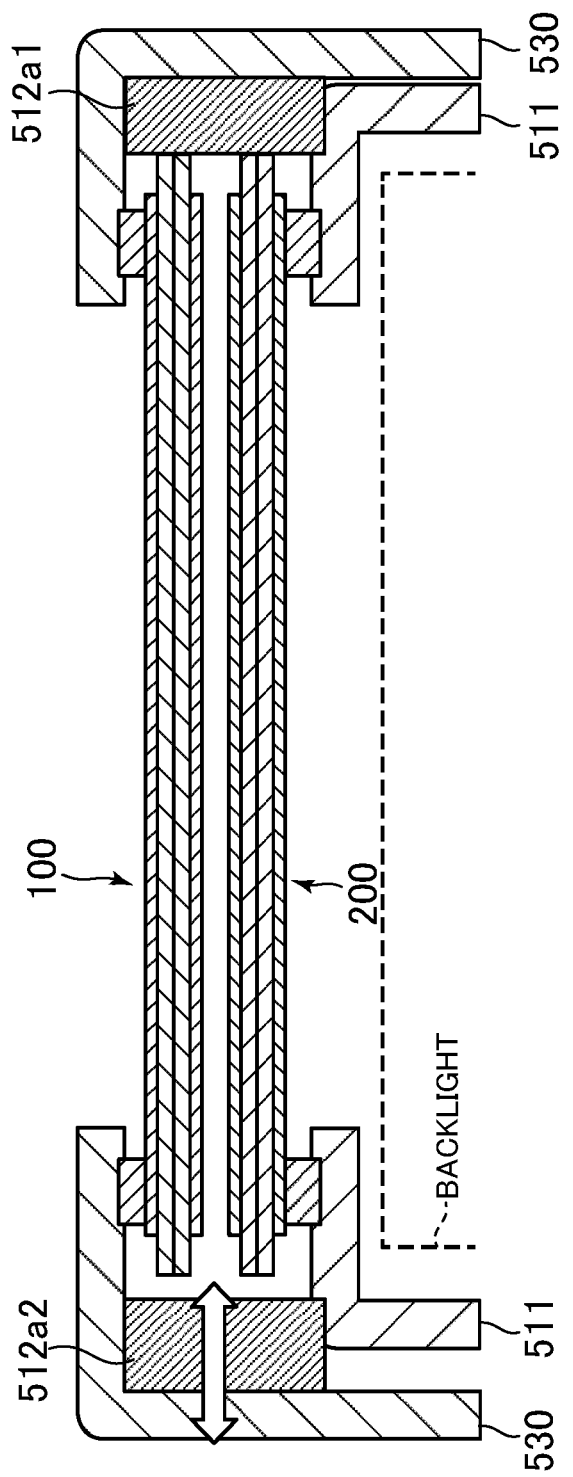
FIG. 8 is a sectional view illustrating a state in which a position adjusting spacer is horizontally moved.
Figure 9:
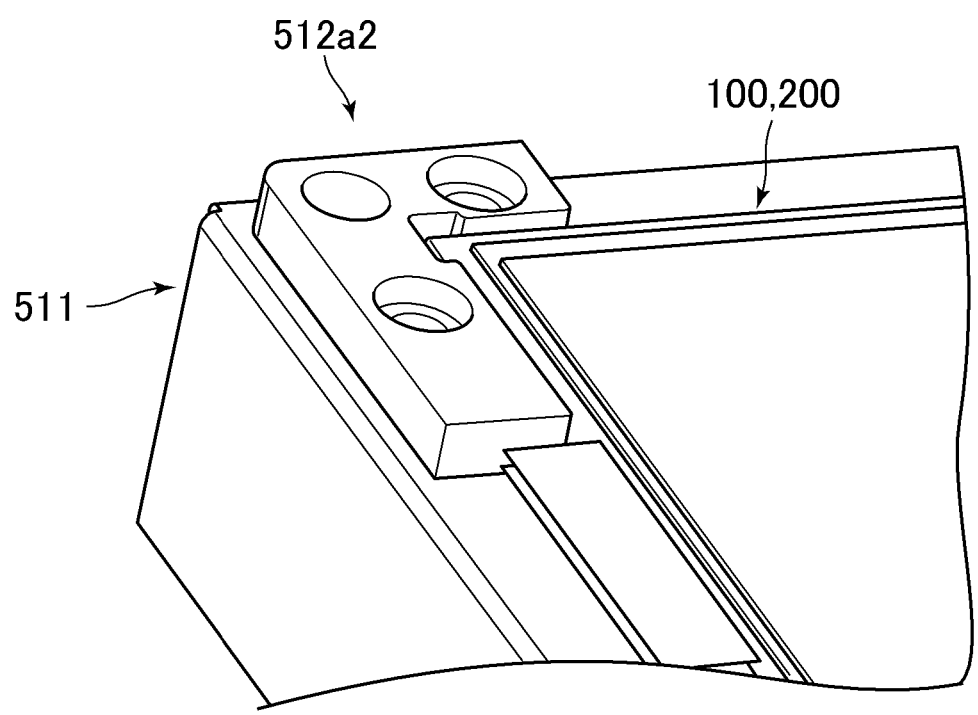
FIG. 9 is a perspective view illustrating a state in which a position adjusting spacer is in contact with the corners of a first display panel and a second display panel.

A method for positioning first display panel 100 and second display panel 200 will be described with reference to FIG. 6 and FIGS. 7A and 7B. First, upper resin spacer 512a for reference (hereinafter, referred to as reference spacer 512a1) is screwed on metallic frame unit 511. Then, first display panel 100 and second display panel 200 are placed on metallic frame unit 511 such that the corners (two sides adjacent to each other) of first display panel 100 and second display panel 200 are positioned in the surroundings of reference spacer 512a1. Then, three position adjusting spacers 512a2 are attached to respective corners of metallic frame unit 511 such that each protruding section 5a is fitted in corresponding receiver 511a. Then, each of three position adjusting spacers 512a2 is horizontally moved while pushed against corresponding corners of first display panel 100 and second display panel 200, and the outer peripheral ends of display panels 100, 200 are pushed against reference spacer 512a1. FIG. 8 is a sectional view illustrating a state in which position adjusting spacer 512a2 is horizontally moved. FIG. 9 is a perspective view illustrating a state in which position adjusting spacer 512a2 is in contact with the corners of first display panel 100 and second display panel 200. Therefore, the four corners of each of first display panel 100 and second display panel 200 are in contact with four upper resin spacers 512a. Finally position adjusting spacers 512a2 are screwed on metallic frame unit 511.

Thus, first display panel 100 and second display panel 200 can be positioned. In the above-described configuration, position adjusting spacers 512a2 are respectively disposed in three corners. Alternatively, one position adjusting spacer 512a2 may be disposed only in a corner located on a diagonal line formed with reference spacer 512a1 and the corner.

Figure 10:
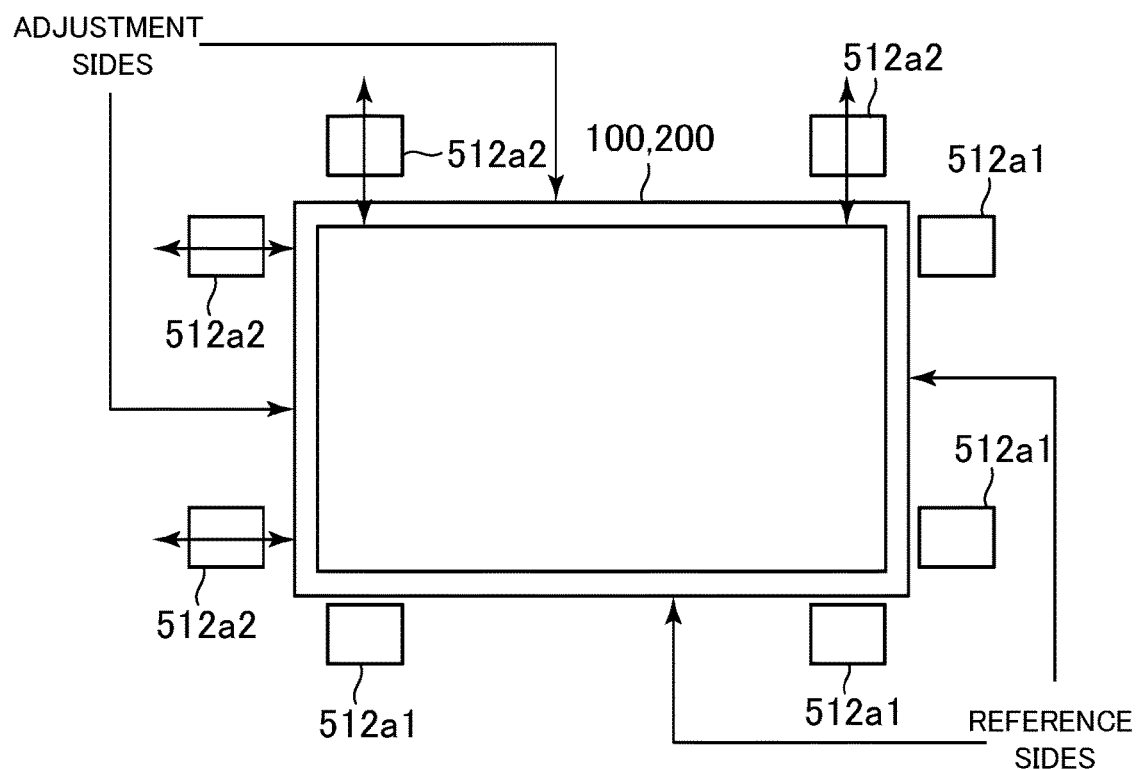
FIG. 10 is a plan view illustrating another configuration that positions a first display panel and a second display panel.

The shapes of reference spacer 512a1 and position adjusting spacers 512a2 are not limited to the above-described configuration. For example, as illustrated in FIG. 10, reference spacers 512a1 and position adjusting spacers 512a2 may be formed into a rectangular shape. In this case, using two sides (right and lower sides in FIG. 10) adjacent to each other as reference sides, at least one reference spacers 512a1 are disposed in each reference side, and using the remaining two sides (left and upper sides in FIG. 10) adjacent to each other as adjustment sides, at least one position adjusting spacers 512a2 are disposed in each adjustment side. Thus, first display panel 100 and second display panel 200 can be positioned.

The shapes of protruding section 5a and receiver 511a are not limited to the circular shape, but protruding section 5a and receiver 511a may have an elliptical shape or a rectangular shape. Reference spacer 512a1 and position adjusting spacers 512a2 may be made of an elastic member (for example, rubber).

As described above, in liquid crystal display device 10 of the present exemplary embodiment, middle frame 510 mainly has a characteristic configuration, which allows the improvement of the heat dissipation property of the driver IC and the improvement of positioning accuracy of first display panel 100 and second display panel 200. A known configuration can be applied to first display panel 100 and second display panel 200. Configuration examples of first display panel 100 and second display panel 200, which can be applied to liquid crystal display device 10 will be described below.

Figure 11:
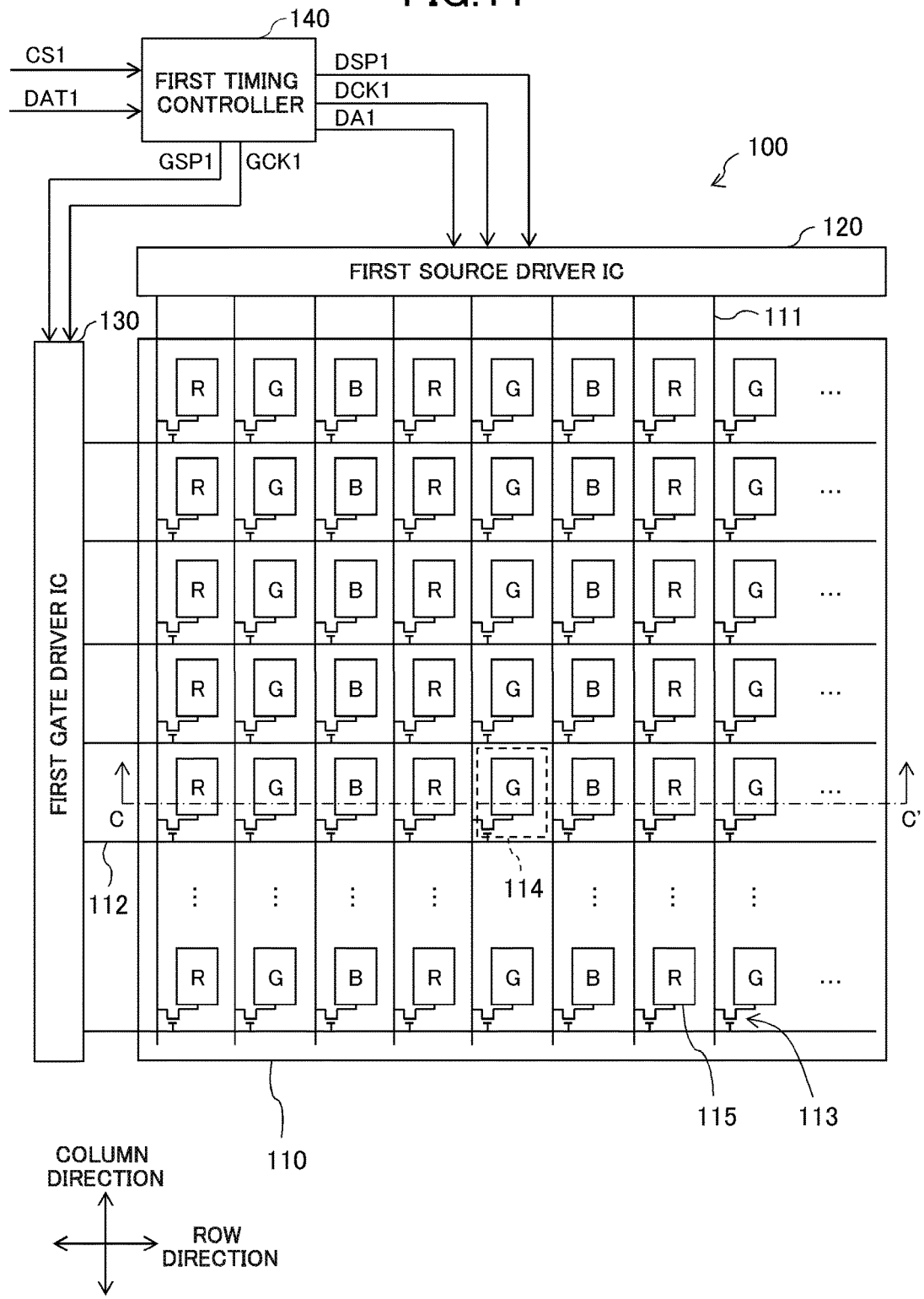
FIG. 11 is a plan view illustrating a schematic configuration of first display panel.
Figure 12:
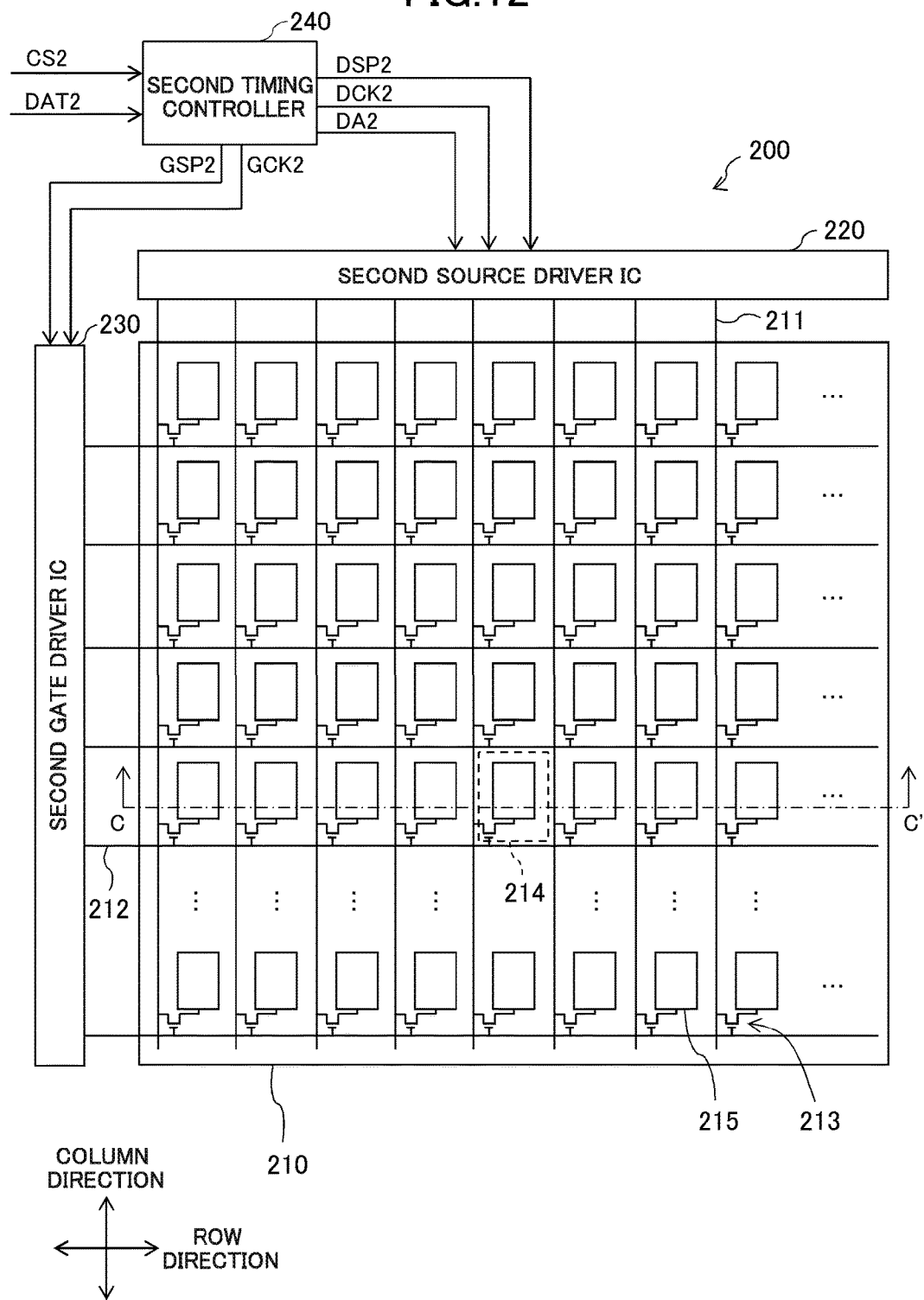
FIG. 12 is a plan view illustrating a schematic configuration of second display panel.
Figure 13:
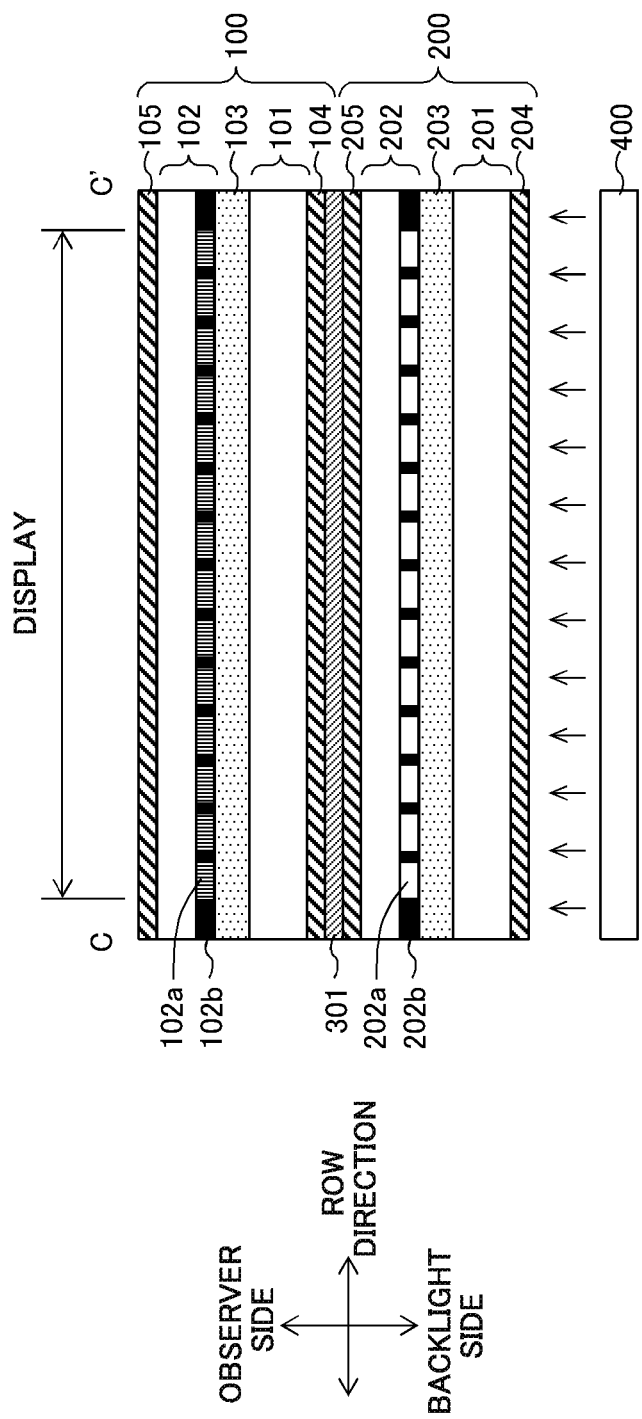
FIG. 13 is a sectional view taken along lines C-C' in FIGS. 11 and 12.

FIG. 11 is a plan view illustrating a schematic configuration of first display panel 100, and FIG. 12 is a plan view illustrating a schematic configuration of second display panel 200. FIG. 13 is a sectional view taken along lines C-C' in FIGS. 11 and 12. In FIGS. 11 and 12, the plurality of first source driver ICs 120 (see FIG. 1) are collectively illustrated as one first source driver IC 120. The same holds true for other driver ICs.

A configuration of first display panel 100 will be described with reference to FIGS. 11 and 13. As illustrated in FIG. 13, first display panel 100 includes thin-film-transistor substrate 101 (hereinafter, referred to as a TFT substrate) disposed on the side of backlight 400, color filter substrate 102 (hereinafter, referred to as a CF substrate), which is disposed on the observer side while being opposite to TFT substrate 101, and liquid crystal layer 103 disposed between TFT substrate 101 and CF substrate 102. Polarizing plate 104 is disposed on the side of backlight 400 of first display panel 100, and polarizing plate 105 is disposed on the observer side.

In TFT substrate 101, as illustrated in FIG. 11, a plurality of data lines 111 extending in a first direction (for example, a column direction), a plurality of gate lines 112 extending in a second direction (for example, a row direction) different from the first direction are formed, and thin film transistor 113 (hereinafter, referred to as a TFT) is formed near an intersection between each of the plurality of data lines 111 and each of the plurality of gate lines 112.

In planar view of first display panel 100, a region surrounded by two data lines 111 adjacent to each other and two gate lines 112 adjacent to each other is defined as one pixel 114, and a plurality of pixels 114 are disposed in a matrix form (the row direction and the column direction). The plurality of data lines 111 are disposed at equal intervals in the row direction, and the plurality of gate lines 112 are disposed at equal intervals in the column direction. In TFT substrate 101, pixel electrode 115 is formed in each pixel 114, and one common electrode (not illustrated) common to the plurality of pixels 114 is formed. A drain electrode constituting TFT 113 is electrically connected to data line 111, a source electrode constituting TFT 113 is electrically connected to pixel electrode 115, and a gate electrode constituting TFT 113 is electrically connected to gate line 112.

As illustrated in FIG. 13, a plurality of colored portions 102a each of which corresponds to pixel 114 are formed on CF substrate 102. Each colored portion 102a is surrounded by black matrix 102b blocking light transmission. For example, each colored portion 102a is formed into a rectangular shape. The plurality of colored portions 102a include red portions made of a red (R color) material to transmit red light, green portions made of a green (G color) material to transmit green light, and blue portions made of a blue (B color) material to transmit blue light. One of the red portions, one of the green portions, and one of the blue portions are repeatedly arranged in this order in the row direction, the colored portions having the same color are arranged in the column direction, and black matrices 102b are formed in boundaries of colored portions 102a adjacent in the row and column directions. According to colored portions 102a, the plurality of pixels 114 include red pixels 114R corresponding to the red portions, green pixels 114G corresponding to the green portions, and blue pixels 114B corresponding to the blue portions as illustrated in FIG. 11.

Although an in-plane-switching (IPS) type pixel structure is cited as an example of first display panel 100, first display panel 100 is not limited to the IPS type pixel structure. A layered structure of each unit constituting pixel 114 is not limited to the above-described configuration.

First timing controller 140 corresponding to first display panel 100 has a known configuration. For example, based on first image data DAT1 and first control signal CS1 (such as a clock signal, a vertical synchronizing signal, or a horizontal synchronizing signal), which are output from an image processor, first timing controller 140 generates various timing signals (data start pulse DSP1, data clock DCK1, gate start pulse GSP1, and gate clock GCK1) to control first image data DA1 and drive of first source driver IC 120 and first gate driver IC 130 (see FIG. 11). First timing controller 140 outputs first image data DA1, data start pulse DSP1, and data clock DCK1 to first source driver IC 120, and outputs gate start pulse GSP1 and gate clock GCK1 to first gate driver IC 130.

First source driver IC 120 outputs a data signal (data voltage) corresponding to first image data DA1 to data lines 111 based on data start pulse DSP1 and data clock DCK1. First gate driver IC 130 outputs a gate signal (gate voltage) to gate lines 112 based on gate start pulse GSP1 and gate clock GCK1.

The data voltage is supplied from first source driver IC 120 to each data line 111, and the gate voltage is supplied from first gate driver IC 130 to each gate line 112. Common voltage $V_{com}$ is supplied from a common driver (not illustrated) to the common electrode. When the gate voltage (gate-on voltage) is supplied to gate line 112, TFT 113 connected to gate line 112 is turned on, and the data voltage is supplied to pixel electrode 115 through data line 111 connected to TFT 113. An electric field is generated by a difference between the data voltage supplied to pixel electrode 115 and common voltage $V_{com}$ supplied to the common electrode. The liquid crystal is driven by the electric field, and transmittance of backlight 400 is controlled, thereby displaying an image. In first display panel 100, a color image is displayed by supply of a desired data voltage to data line 111 connected to pixel electrode 115 of each of red pixel 114R, green pixel 114G, and blue pixel 114B.

Next, a configuration of second display panel 200 will be described below with reference to FIGS. 12 and 13. As illustrated in FIG. 13, second display panel 200 includes TFT substrate 201 disposed on the side of backlight 400, CF substrate 202, which is disposed on the observer side while being opposite to TFT substrate 201, and liquid crystal layer 203 disposed between TFT substrate 201 and CF substrate 202. Polarizing plate 204 is disposed on the side of backlight 400 of second display panel 200, and polarizing plate 205 is disposed on the observer side. Diffusion sheet 301 is disposed between polarizing plate 104 of first display panel 100 and polarizing plate 205 of second display panel 200.

In TFT substrate 201, as illustrated in FIG. 12, a plurality of data lines 211 extending in the column direction, a plurality of gate lines 212 extending in the row direction are formed, and TFT 213 is formed near an intersection between each of the plurality of data lines 211 and each of the plurality of gate lines 212. In planar view of second display panel 200, a region surrounded by two data lines 211 adjacent to each other and two gate lines 212 adjacent to each other is defined as one pixel 214, and a plurality of pixels 214 are disposed in a matrix form (the row direction and the column direction). The plurality of data lines 211 are disposed at equal intervals in the row direction, and the plurality of gate lines 212 are disposed at equal intervals in the column direction. In TFT substrate 201, pixel electrode 215 is formed in each pixel 214, and one common electrode (not illustrated) common to the plurality of pixels 214 is formed. A drain electrode constituting TFT 213 is electrically connected to data line 211, a source electrode constituting TFT 213 is electrically connected to pixel electrode 215, and a gate electrode constituting TFT 213 is electrically connected to gate line 212.

As illustrated in FIG. 13, in CF substrate 202, black matrix 202*b* blocking light transmission is formed at a position corresponding to a boundary of each pixel 214. The colored portion is not formed in region 202*a* surrounded by black matrix 202*b*. For example, an overcoat film is formed in region 202*a*.

Although the IPS type pixel structure is cited as an example of second display panel 200, second display panel 200 is not limited to the IPS type pixel structure. A layered structure of each unit constituting pixel 214 is not limited to the above-described configuration.

Based on second image data DAT2 and second control signal CS2 (such as a clock signal, a vertical synchronizing signal, or a horizontal synchronizing signal), which are output from an image processor, second timing controller 240 generates various timing signals (data start pulse DSP2, data clock DCK2, gate start pulse GSP2, and gate clock GCK2) to control second image data DA2 and drive of second source driver IC 220 and second gate driver IC 230 (see FIG. 12). Second timing controller 240 outputs second image data DA2, data start pulse DSP2, and data clock DCK2 to second source driver IC 220, and outputs gate start pulse GSP2 and gate clock GCK2 to second gate driver IC 230.

Second source driver IC 220 outputs the data voltage corresponding to second image data DA2 to data lines 211 based on data start pulse DSP2 and data clock DCK2. Second gate driver IC 230 outputs the gate voltage to gate lines 212 based on gate start pulse GSP2 and gate clock GCK2.

The data voltage is supplied from second source driver IC 220 to each data line 211, and the gate voltage is supplied from second gate driver IC 230 to each gate line 212. Common voltage $V_{com}$ is supplied from the common driver to the common electrode. When the gate voltage (gate-on voltage) is supplied to gate line 212, TFT 213 connected to gate line 212 is turned on, and the data voltage is supplied to pixel electrode 215 through data line 211 connected to TFT 213. An electric field is generated by a difference between the data voltage supplied to pixel electrode 215 and common voltage $V_{com}$ supplied to the common electrode. The liquid crystal is driven by the electric field, and transmittance of backlight 400 is controlled, thereby displaying an image. The monochrome image is displayed on second display panel 200.

Figure 14:
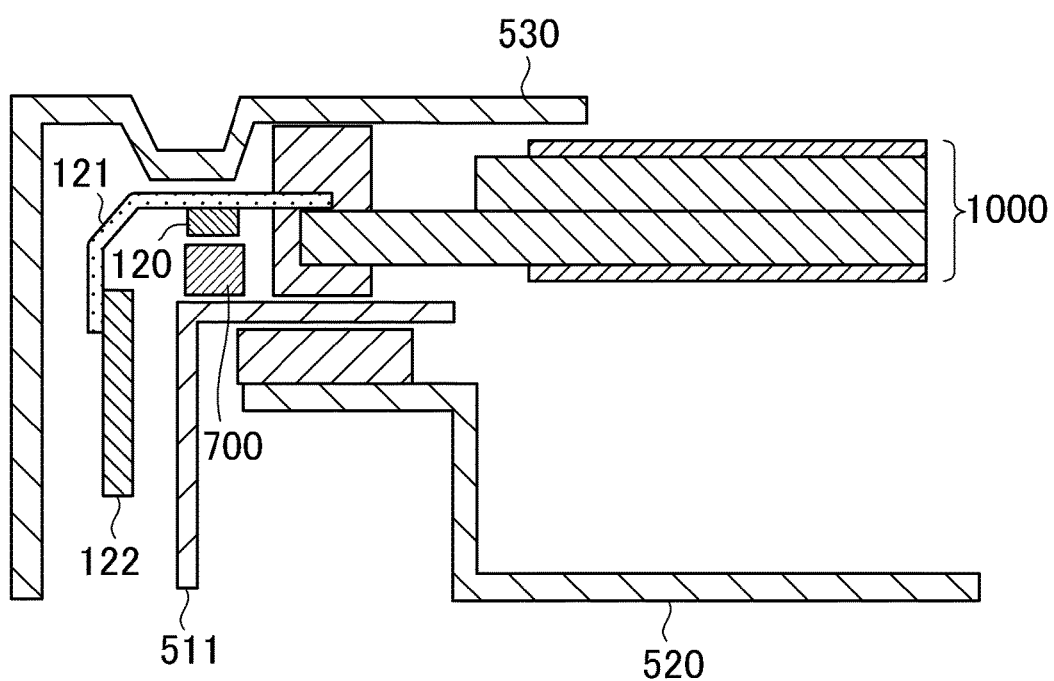
FIG. 14 is a sectional view illustrating a partial configuration of liquid crystal display device provided with one display panel.

Liquid crystal display device 10 of the exemplary embodiment described above includes the plurality of (for example, two) display panels. Alternatively, the display device of the present disclosure may include one display panel. FIG. 14 is a sectional view illustrating a partial configuration of liquid crystal display device 10 provided with one display panel 1000. FIG. 14 illustrates a configuration that dissipates the heat generated in source driver IC 120. Specifically, elastic member 700 (for example, rubber) having the high heat dissipation property and metallic frame unit 511 of middle frame 510 are disposed on the backlight side of source driver IC 120, and metallic upper frame 530 is disposed on the observer side. Therefore, source driver IC 120 is sandwiched between metallic upper frame 530 and metallic frame unit 511, so that the heat dissipation property of source driver IC120 can be improved.

Also in liquid crystal display device 10 including one display panel 1000, the positioning configuration illustrated in FIG. 6 and the like can be applied when display panel 1000 is attached to middle frame 510.

In the above, the specific embodiments of the present application have been described, but the present application is not limited to the above-mentioned embodiments, and various modifications may be made as appropriate without departing from the spirit of the present application.

What is claimed is:

1. A display device comprising:
   a display panel that displays an image;
   a driver IC that outputs a driving signal to the display panel;
   a flexible substrate on which the driver IC is mounted;
   a first frame that supports the display panel from a side of a light source that emits light toward the display panel; and
   a second frame that supports the light source while being provided independently of the first frame, wherein
   the first frame includes a metallic frame unit, the metallic frame unit is opposite to the driver IC from the side of the light source,
   an elastic member having a heat dissipation property is disposed between the driver IC and the metallic frame unit, and
   heat generated in the driver IC is transferred to the metallic frame unit through the elastic member.

2. The display device according to claim 1, wherein the heat generated in the driver IC is transferred to the metallic frame unit through the elastic member by heat conduction in solids.

3. The display device according to claim 1, further comprising:
   a third frame that is made of a metallic material and covers an outer peripheral area of the display panel, wherein
   the display panel includes a first display panel and a second display panel disposed closer to the light source than the first display panel,
   the driver IC includes a first driver IC that outputs a driving signal to the first display panel and a second driver IC that outputs a driving signal to the second display panel, and
   the first driver IC is opposite to the third frame while the second driver IC is opposite to the metallic frame unit.

4. The display device according to claim 3, wherein
the first driver IC is in contact with the third frame, or in contact with the third frame through another member interposed between the first driver IC and the third frame.

5. The display device according to claim 3, wherein
in planar view, the first driver IC is disposed on a first side of a display screen, and the second driver IC is disposed on a second side opposite to the first side of the display screen.

6. The display device according to claim 3, wherein
the first frame includes a resin spacer, and
the resin spacer retains a distance between the first frame and the third frame.

7. The display device according to claim 6, wherein
the flexible substrate includes a plurality of first flexible substrates on each of which a corresponding first driver IC is mounted and a plurality of second flexible substrates on each of which a corresponding second driver IC is mounted, and
the resin spacer includes a first resin spacer protruding from a first frame side toward a third frame side between first flexible substrates of the plurality of first flexible substrates that are adjacent to each other, and a second resin spacer protruding from the first frame side toward the third frame side between second flexible substrates of the plurality of second flexible substrates that are adjacent to each other.

8. The display device according to claim 1, wherein
the metallic frame unit includes a sidewall extending in a direction perpendicular to a display screen,
the second frame includes a sidewall extending in the direction perpendicular to the display screen, and
a gap is formed between the sidewall of the metallic frame unit and the sidewall of the second frame.

9. A display device comprising:
a display panel that displays an image;
a driver IC that outputs a driving signal to the display panel;
a flexible substrate on which the driver IC is mounted;
a first frame that supports the display panel from a side of a light source that emits light toward the display panel;
a second frame that supports the light source while being provided independently of the first frame; and
a third frame that is made of a metallic material and covers an outer peripheral area of the display panel,
wherein the first frame includes a metallic frame unit, the metallic frame unit is opposite to the driver IC from the side of the light source,
the display panel includes a first display panel and a second display panel disposed closer to the light source than the first display panel, and
the driver IC includes a first driver IC that outputs a driving signal to the first display panel and a second driver IC that outputs a driving signal to the second display panel, and the first driver IC is opposite to the third frame while the second driver IC is opposite to the metallic frame unit.

10. The display device according to claim 9, wherein
heat generated in the second driver IC is transferred to the metallic frame unit by heat conduction in solids.

11. The display device according to claim 9, wherein
the second driver IC is in direct contact with the metallic frame unit, or in contact with the metallic frame unit through another member interposed the second driver IC and the metallic frame unit.

12. The display device according to claim 9, wherein
the first driver IC is in contact with the third frame, or in contact with the third frame through another member interposed between the first driver IC and the third frame.

13. The display device according to claim 9, wherein
in planar view, the first driver IC is disposed on a first side of a display screen, and the second driver IC is disposed on a second side opposite to the first side of the display screen.

14. The display device according to claim 9, wherein
the first frame includes a resin spacer, and
the resin spacer retains a distance between the first frame and the third frame.

15. The display device according to claim 14, wherein
the flexible substrate includes a plurality of first flexible substrates on each of which a corresponding first driver IC is mounted and a plurality of second flexible substrates on each of which a corresponding second driver IC is mounted, and
the resin spacer includes a first resin spacer protruding from a first frame side toward a third frame side between first flexible substrates of the plurality of first flexible substrates that are adjacent to each other, and a second resin spacer protruding from the first frame side toward the third frame side between second flexible substrates of the plurality of second flexible substrates that are adjacent to each other.

16. The display device according to claim 9, wherein
the metallic frame unit includes a sidewall extending in a direction perpendicular to a display screen,
the second frame includes a sidewall extending in the direction perpendicular to the display screen, and
a gap is formed between the sidewall of the metallic frame unit and the sidewall of the second frame.

* * * * *